(12) United States Patent
Tai et al.

(10) Patent No.: US 7,252,512 B2
(45) Date of Patent: Aug. 7, 2007

(54) SELF-ALIGNMENT MAGNETIC CONNECTOR REDUCED IN SIZE

(75) Inventors: Tomishige Tai, Ome (JP); Hiroshi Akimoto, Ome (JP); Katsumi Arai, Tachikawa (JP); Takahiro Uchidate, Akishima (JP); Mitsuo Koguchi, Ome (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 435 days.

(21) Appl. No.: 10/828,918

(22) Filed: Apr. 21, 2004

(65) Prior Publication Data
US 2005/0239261 A1  Oct. 27, 2005

(51) Int. Cl.
*H01R 11/30* (2006.01)
*H01R 13/60* (2006.01)

(52) U.S. Cl. ....................................................... 439/39

(58) Field of Classification Search ............ 439/38–40
See application file for complete search history.

(56) References Cited

U.S. PATENT DOCUMENTS 5,829,987 A * 11/1998 Fritsch et al. ................. 439/38

FOREIGN PATENT DOCUMENTS

| JP | 6342679 | 12/1974 |
| JP | 05-135833 | 6/1993 |
| JP | 10-112354 | 4/1998 |
| JP | 2001-210933 | 5/2001 |

* cited by examiner

*Primary Examiner*—Javaid H. Nasri
(74) *Attorney, Agent, or Firm*—Collard & Roe, P.C.

(57) ABSTRACT

In a magnetic connector acquiring connection with a mating connector by magnetic force, a base member has a particular surface to be faced to the mating connector upon connection. An electrode terminal is fixed to the base member and adapted to be electrically connected to the mating connector. The base member has a magnetic force generating portion having a plurality of magnetic poles for producing the magnetic force. N and the S poles of the magnetic poles are alternately arranged along the particular surface in a predetermined direction. Thus, the connector is properly positioned relative to the mating connector by the magnetic force.

13 Claims, 16 Drawing Sheets

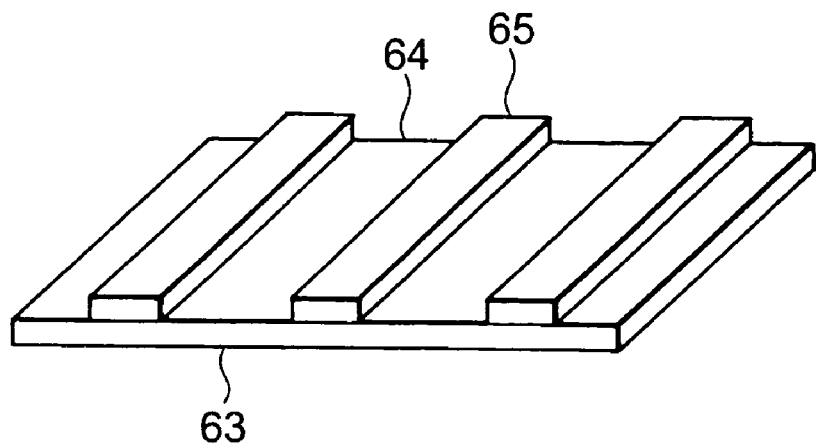
FIG. 29A
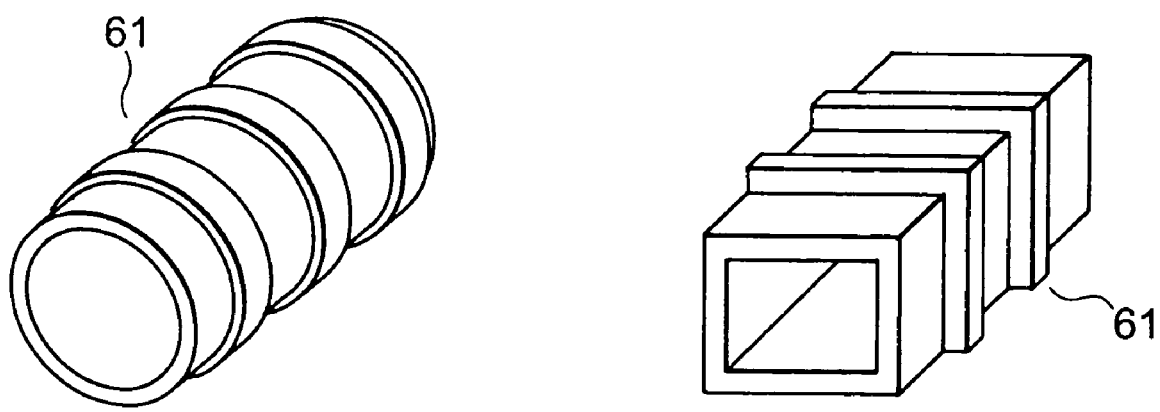
FIG. 29BFIG. 29C

SELF-ALIGNMENT MAGNETIC CONNECTOR REDUCED IN SIZE

BACKGROUND OF THE INVENTION

This invention relates to a connector acquiring connection by magnetic force (herein referred to as a "magnetic connector").

A connector of the type is disclosed, for example, in Japanese Patent Application Publication (JP-A) No. H6-342679 and comprises a body provided with a pin contact and a magnet. By attractive force of the magnet, a mating connector is attracted so that the pin contact is contacted with a contact member of the mating connector. Thus, electrical connection between the connector and the mating connector is obtained.

In order to avoid misalignment or displacement between the pin contact and the contact member of the mating connector, the body is provided with a pair of guide ramps or slopes. Upon connection, the mating connector is guided between the guide ramps and automatically adjusted in relative position with respect to the connector. Thus, reliable contact between the pin contact and the contact member of the mating connector is assured.

However, the above-mentioned structure including the guide ramps results in an increase in size of the connector. Therefore, the above-mentioned technique is not suitable for a recent connector required to be smaller in size. In addition, the mating connector may be engaged with the guide ramps in an inclined position so that proper connection is not obtained.

SUMMARY OF THE INVENTION

It is therefore an object of the present invention to provide a magnetic connector which can easily be reduced in size and which assures proper connection.

Other objects of the present invention will become clear as the description proceeds.

According to an aspect of the present invention, there is provided a magnetic connector acquiring connection with a mating connector by magnetic force, the connector comprising a base member having a particular surface to be faced to the mating connector upon connection and an electrode terminal fixed to the base member and adapted to be electrically connected to the mating connector, the base member having a magnetic force generating portion having a plurality of magnetic poles for producing the magnetic force, N and the S poles of the magnetic poles being alternately arranged along the particular surface in a predetermined direction, the connector being properly positioned relative to the mating connector by the magnetic force.

According to another aspect of the present invention, there is provided a magnetic connector apparatus comprising first and second connectors connected to each other by magnetic force, the first connector having a magnet and a stopper adjacent to the magnet, the second connector having a magnet with different magnetic poles alternately arranged, the second connector being butted to the stopper by repulsive force produced between the magnets of the first and the second connectors, thereby positioning the first and the second connectors relative to each other.

According to still another object of the present invention, there is provided a magnetic connector acquiring connection with a mating connector by magnetic force, the connector comprising a peripheral electrode having a particular surface to be faced to the mating connector upon connection and a groove formed in the particular surface, an insulating member disposed in the groove, a center electrode fixed to the insulating member, and a magnet fixed to a rear surface of the peripheral electrode opposite to the particular surface and producing the magnetic force.

BRIEF DESCRIPTION OF THE DRAWINGS

FIGS. 29A to 29C are views for describing a production process of a connector contained in the connector apparatus in FIG. 28 together with a modification of the connector.

DESCRIPTION OF PREFERRED EMBODIMENTS

Figure 2:
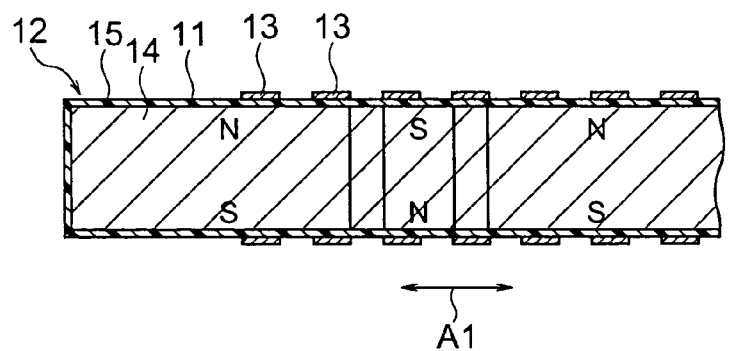
FIG. 2 is an enlarged sectional view of a characteristic part of the connector, taken along a line II-II in FIG. 1.
Figure 3:
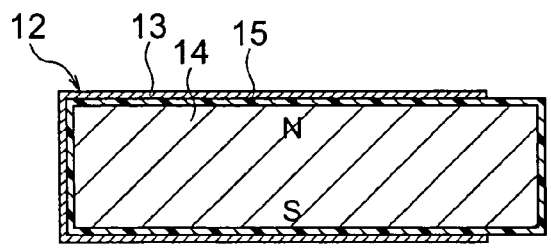
FIG. 3 is an enlarged sectional view of the connector, taken along a line III-III in FIG. 1.

At first referring to FIGS. 1 to 3, description will be made of a magnetic connector according to a first embodiment of this invention.

The magnetic connector 10 illustrated in the figures acquires connection with a mating connector (not shown) by magnetic attractive force. The magnetic connector 10 comprises a base member 12 having a particular surface 11 as a flat surface to be faced to the mating connector upon acquiring connection, and a plurality of conductive electrode terminals 13 fixed to the base member 12 at a predetermined pitch to be electrically connected to the mating connector. The base member 12 has a magnetic force generating portion 14 for generating magnetic force, and an elastic insulating layer 15 connected to the magnetic force generating portion 14 and defining the particular surface 11. The magnetic force generating portion 14 has different magnetic poles, i.e., N and S poles, alternately arranged along the particular surface 11 in a predetermined direction A1.

Each of the electrode terminals 13 comprises a patterned metal film fixed to the insulating layer 15 and surrounding the magnetic force generating portion 14 in a plane perpendicular to the predetermined direction A1. Therefore, a part of each electrode terminal 13 extends along the particular surface 11.

Figure 4:
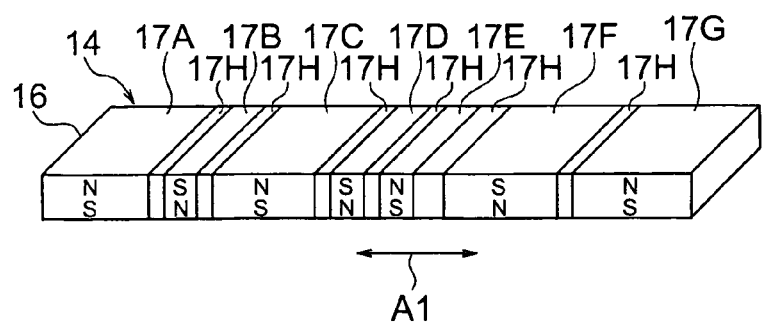
FIG. 4 is a perspective view for describing a magnetic force generating portion of the connector illustrated in FIG. 1.

Referring to FIG. 4, the magnetic force generating portion 14 will be described in detail.

The magnetic force generating potion 14 comprises a plate-like magnetic material, i.e., a magnetic plate 16. By perpendicular magnetization of the magnetic plate 16 in a thickness direction, seven magnets 17A to 17G are formed at different positions to be different in size from one another. Therefore, the seven magnets 17A to 17G have magnetic poles which are of various sizes in the predetermined direction A1 and are arranged in a specific order or pattern. This means that the magnetic poles comprise at least first and second poles which are different from each other in size in the predetermined direction A1.

Between every adjacent ones of the magnets 17A to 17G, an unmagnetized portion, i.e., a neutral region 17H is formed. The magnets 17A to 17G are arranged so that N poles and S poles are alternately reversed in position in the vertical direction, i.e., alternately arranged at upper and lower positions.

The insulating layer 15 is formed on or attached to an entire surface of the magnetic plate 16. The insulating layer 15 may be made of an elastic material such as gel, elastomer, or rubber.

Figure 1:
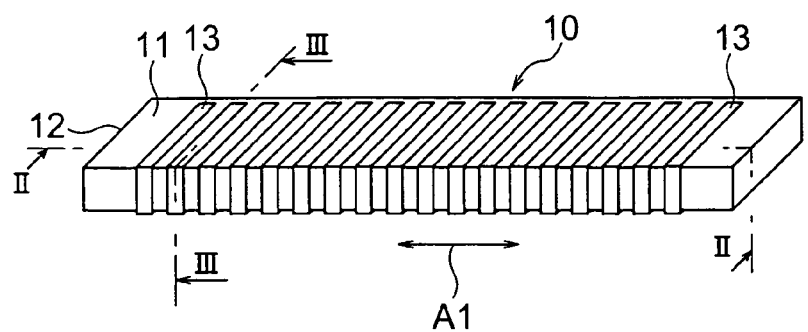
FIG. 1 is a perspective view of a connector according to a first embodiment of this invention.
Figure 5:
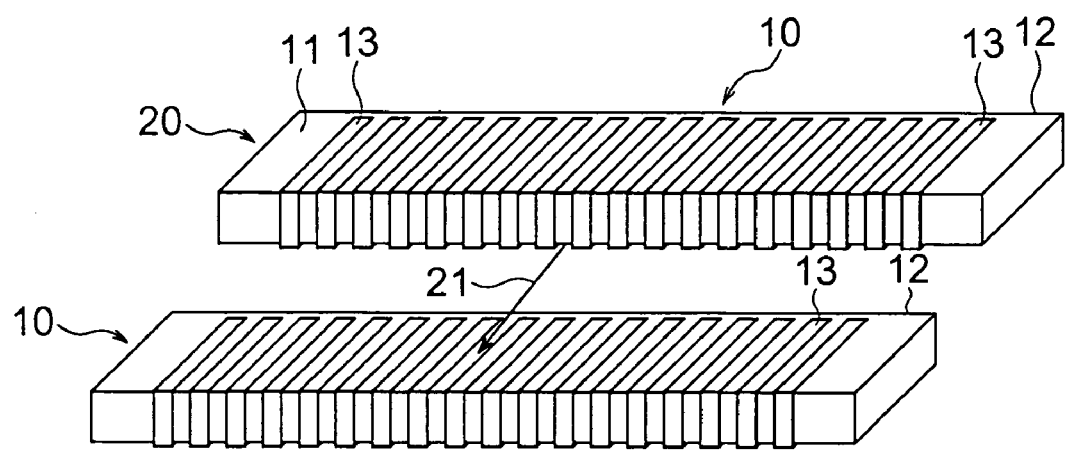
FIG. 5 is a perspective view showing the connector in FIG. 1 before it is connected to another connector of the same type.
Figure 6:
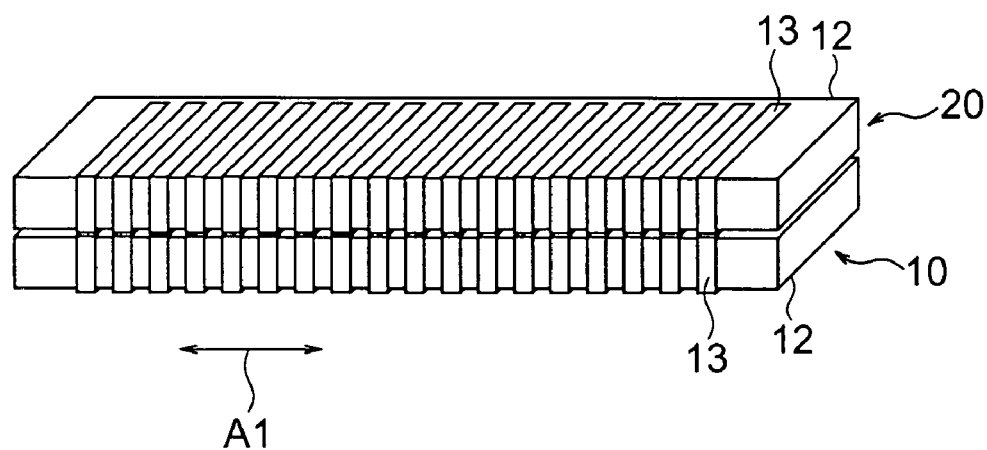
FIG. 6 is a perspective view similar to FIG. 5 after the connectors are connected.

Referring to FIGS. 5 and 6, description will be made of the case where the connector 10 shown in FIG. 1 is electrically connected to another connector as a mating connector 20 which is exactly same in structure to the connector 10.

From a state of FIG. 5, the mating connector 20 is moved towards the particular surface 11 of the connector 10. Under the magnetic attractive force, the mating connector 20 is attracted towards the particular surface 11 of the connector 10 as shown in an arrow 21. More specifically, under the attractive force generated between a combination of the N and the S poles on an upper surface of the connector 10 and a combination of the S and the N poles on a lower surface of the mating connector 20, the mating connector 20 is subjected to driving force or retracting force in the direction depicted by the arrow 21.

As a result, the mating connector 20 is brought into tight contact with the connector 10 as shown in FIG. 6. Accordingly, the electrode terminals 13 of the connector 10 and the mating connector 20 are contacted with each other. Thus, the connector 10 is electrically connected to the mating connector 20. A combination of the connector 10 and the mating connector 20 will be referred to as a magnetic connector apparatus.

Upon connection, in accordance with the direction of the magnetic force related to the relative position of the N and the S poles, the connector 10 and the mating connector 20 are properly positioned relative to each other. Specifically, the N and the S poles of the connector 10 are attracted to the S and the N poles of the mating connector 20, respectively, so that the connector 10 and the mating connector 20 are adjusted in relative position in the predetermined direction A1. It is noted here that, since the N and the S poles of the seven magnets are different in size in the predetermined direction A1 and are arranged in a specific order or pattern in common in each of the connector 10 and the mating connector 20, the arrangement of the N and the S poles on the particular surface 11 of the connector 10 is complementary to that of the mating connector 20. Therefore, proper connection is reliably obtained.

Figure 7:
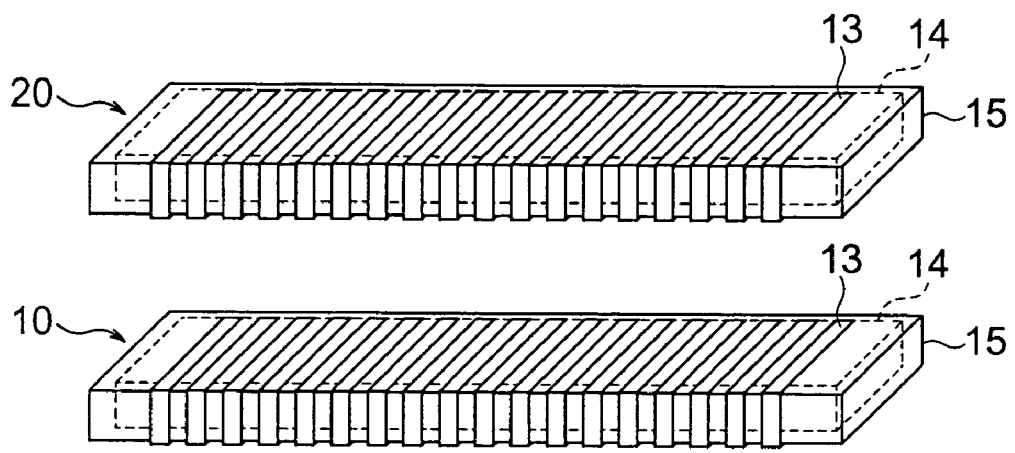
FIG. 7 is a perspective view of a connector apparatus according to a second embodiment of this invention before connection.
Figure 8:
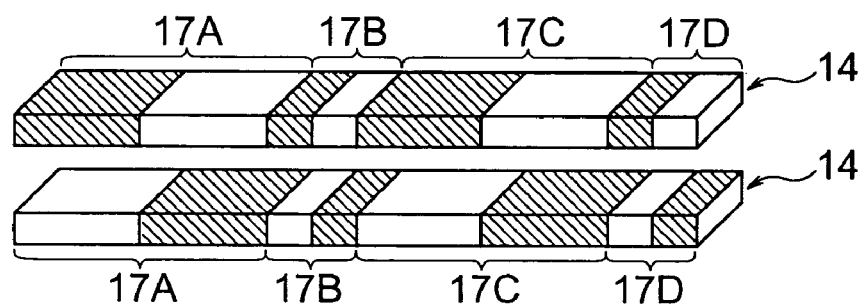
FIG. 8 is a perspective view of a magnetic force generating portion of the connector apparatus in FIG. 7.
Figure 9:
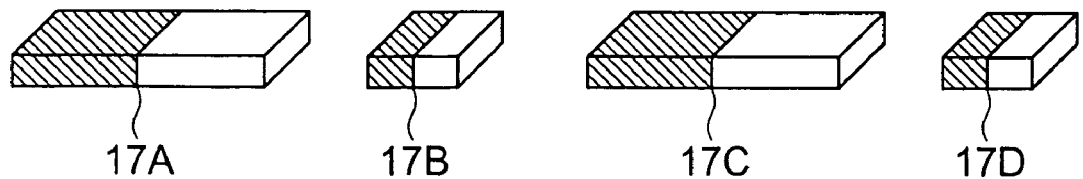
FIG. 9 is an exploded perspective view of the magnetic force generating portion in FIG. 8.

Referring to FIGS. 7 through 9, a magnetic connector according to a second embodiment of this invention will be described. Similar parts are designated by like reference numerals and description thereof will be omitted.

In each of the connector 10 and the mating connector 20 illustrated in the figures, the N and the S poles of the magnetic force generating portion 14 are formed by a plurality of, i.e., four permanent magnets 17A to 17D which are different in size and arranged in series in tight contact with one another. The insulating layer 15 depicted by dotted lines comprises an elastic material such as gel, elastomer, or polyamide fiber. In FIGS. 8 and 9, an N pole side of each magnet is hatched so as to distinguish the polarity.

One of the two magnetic force generating portions 14 illustrated in FIG. 8 is used in the connector 10 while the other is used in the mating connector 20. The permanent magnets 17A to 17D of these magnetic force generating portions 14 are designed to be reversed in polarity to each other in the predetermined direction A1. Such reversed polarities can easily be achieved by using the permanent magnets 17A to 17D magnetized as shown in FIG. 9 in reversed positions in the predetermined direction A. In order to suppress leakage flux between the permanent magnets 17A to 17D, it is preferable that a magnetically neutral member is interposed between every adjacent ones of the permanent magnets 17A to 17D.

Figure 10:
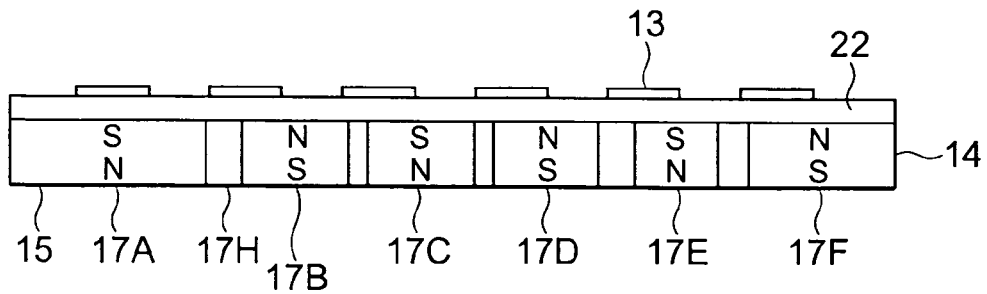
FIG. 10 is a front view of a connector according to a third embodiment of this invention.

Referring to FIG. 10, description will be made of a magnetic connector according to a third embodiment of this invention. Similar parts are designated by like reference numerals and description thereof will be omitted.

The connector illustrated in the figure includes a cohesive layer or a first layer 22 between the magnetic force generating portion 14 and the electrode terminals 13 as thin film electrodes. The permanent magnets 17A to 17D are adhered to a lower surface of the first layer 22. The electrode terminals 13 are adhered to the particular surface 11 defined by an upper surface of the cohesive layer 22. As the first layer 22, gel is used. The magnetic force generating portion 14 has a lower surface with the insulating layer 15 formed thereon.

Figure 11:
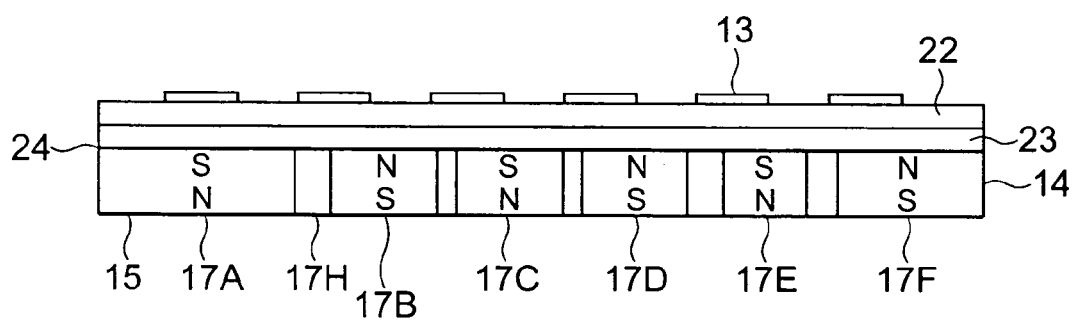
FIG. 11 is a front view of a connector according to a fourth embodiment of this invention.

Referring to FIG. 11, description will be made of a magnetic connector according to a fourth embodiment of this invention. Similar parts are designated by like reference numerals and description thereof will be omitted.

The connector illustrated in the figure comprises a second layer 23 interposed between the magnetic force generating portion 14 and the cohesive layer 22. The first layer is adhered to an upper surface of the second layer 23. The magnetic force generating portion 14 is fixed to a lower surface of the second layer 23 by an adhesive layer 24. The second layer 23 comprises a resin plate of a material such as polyimide resin or thermoplastic polyester resin.

Figure 12:
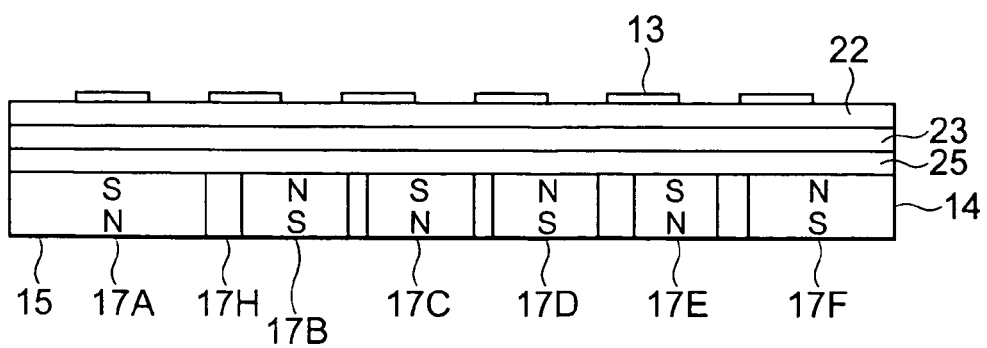
FIG. 12 is a front view of a connector according to a fifth embodiment of this invention.

Referring to FIG. 12, description will be made of a magnetic connector according to a fifth embodiment of this invention. Similar parts are designated by like reference numerals and description thereof will be omitted.

The connector illustrated in the figure comprises another cohesive layer or a third layer 25 interposed between the second layer 23 and the magnetic force generating portion 14 instead of the adhesive layer 24. Specifically, the electrode terminals 13 are fixed to the upper surface of the second layer 23 via the first layer 22 while the magnetic force generating portion 14 is fixed to the lower surface of the second layer 23 via the third layer 25.

Figure 13:
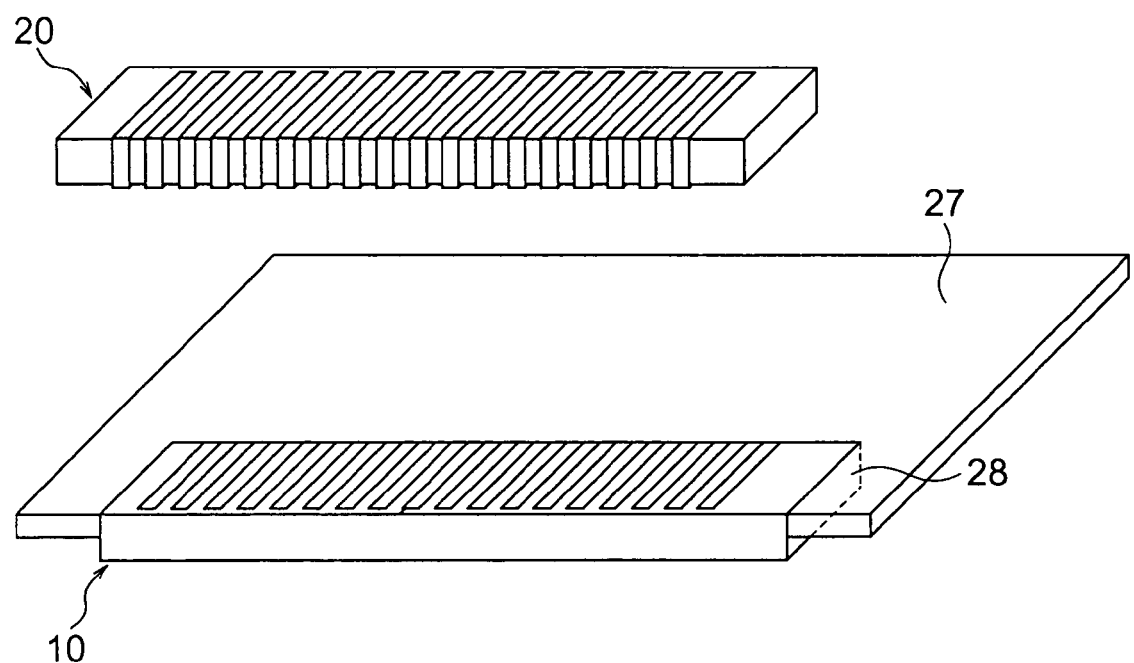
FIG. 13 is a perspective view for describing actual use of the connector.

Referring to FIG. 13, description will be made of actual use of the various magnetic connectors described above.

As illustrated in the figure, the connector 10 is fitted and fixed to a rectangular recess or hole 28 formed in a flat circuit member 27 such as a flexible printed circuit (FPC) or a printed circuit board. The mating connector 20 is moved towards and away from the connector 10 to be connected thereto and disconnected therefrom.

With the various magnetic connectors described above, the electrode terminals 13 can be formed by transfer or patterning such as photo etching. Therefore, the electrode terminals 13 can be formed at a narrower pitch than that achieved before. Because the magnets of the connector and the mating connector arranged in complementary patterns are contacted with each other, magnetic attractive force acts in a direction of automatically correcting misalignment.

Figure 14:
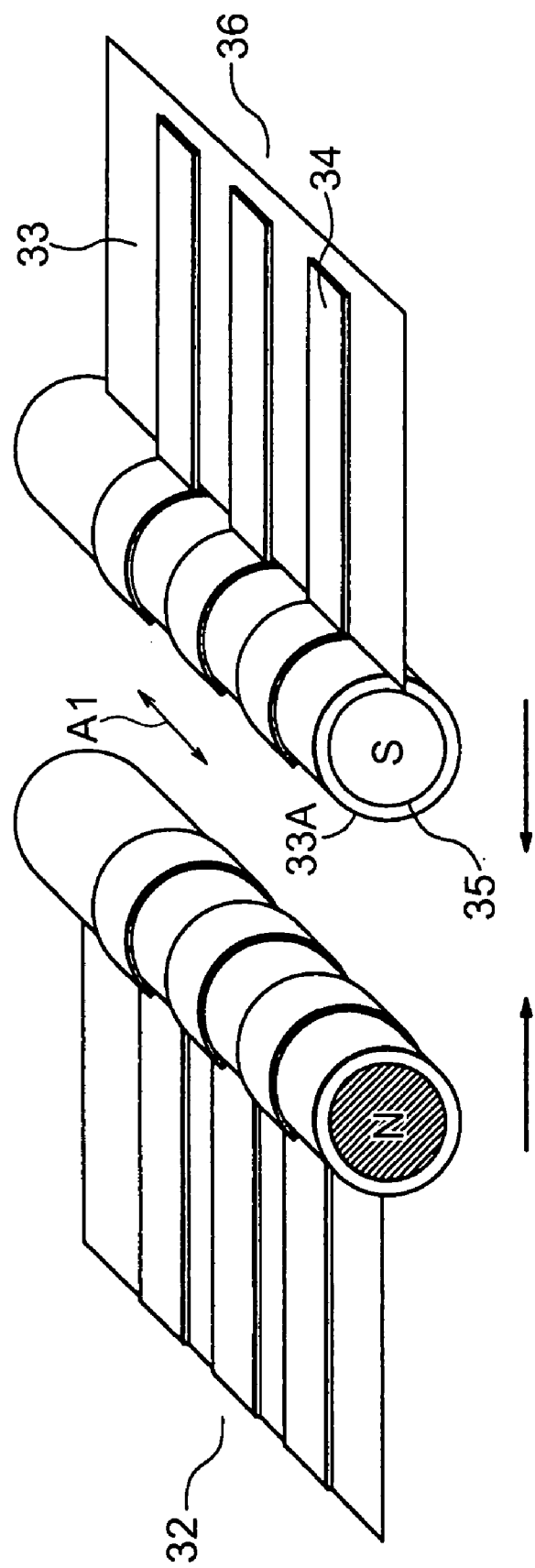
FIG. 14 is a perspective view of a connector apparatus according to a sixth embodiment of this invention.
Figure 15:
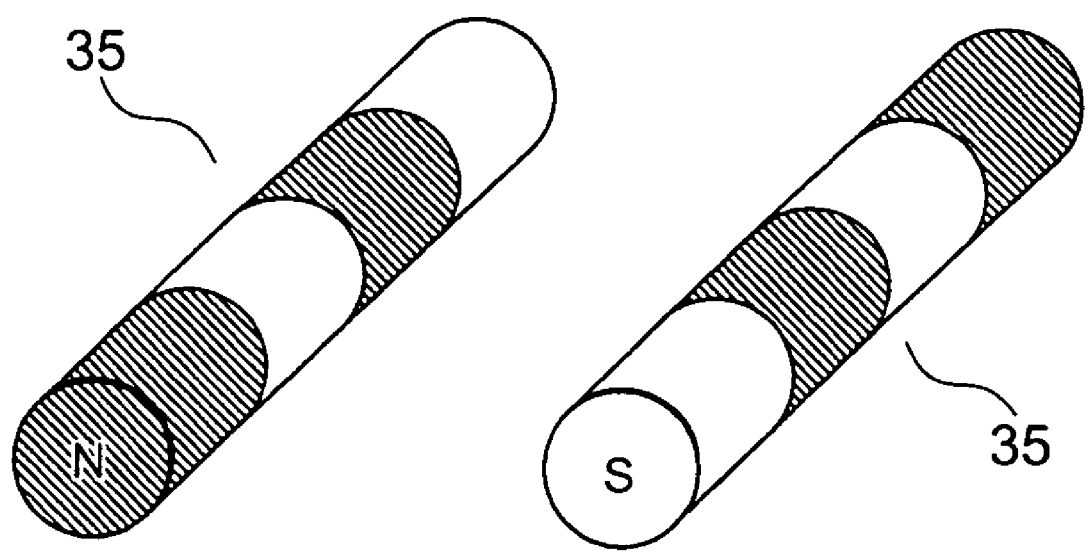
FIG. 15 is a perspective view of a magnetic force generating portion of the connector apparatus in FIG. 14.

Referring to FIGS. 14 and 15, description will be made of a magnetic connector apparatus according to a sixth embodiment of this invention.

The connector apparatus illustrated in the figures is an FPC connector acquiring connection of FPCs by magnetic attractive force. The connector apparatus comprises a first connector 32 and a second connector 36. Each of the first and the second connectors 32 and 36 comprises an insulator 33 having flexibility, three thin film electrodes 34 attached to a surface of the insulator 33 by a cohesive agent, and a magnet 35 received in a cylindrical portion 33A formed at one end of the insulator 33. Each magnet 35 has a cylindrical shape with N poles and S poles, four in total, are alternately arranged in series, and acts as the magnetic force generating portion. Thus, in the connectors 32 and 36, each of particular surfaces to face each other upon connection is cylindrically formed around an axis extending in the predetermined direction A1. In other words, the particular surface is defined by an outer peripheral surface of the cylindrical portion 33A.

Figure 16:
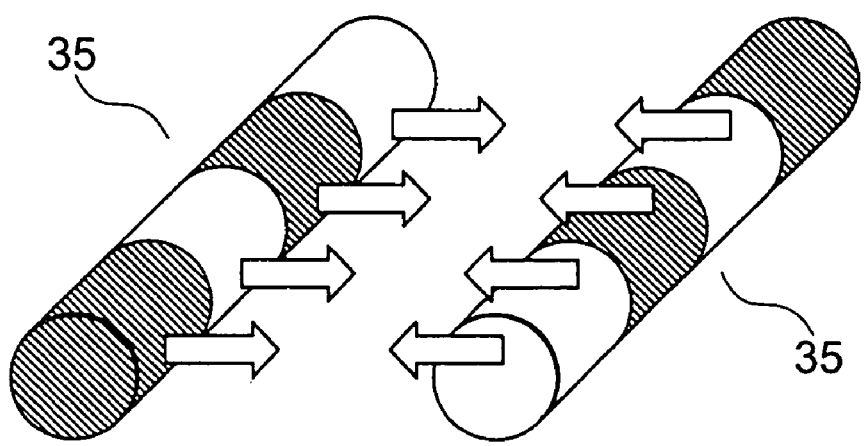
FIGS. 16 and 17 are views for describing a principle of correcting misalignment between connectors of the connector apparatus in FIG. 14.

In case where alignment between the N and the S poles of the first connector 32 and the S and the N poles of the second connector 36 is proper, attractive force acts between different poles of the magnets 35 of the first and the second connectors 32 and 36 as shown in FIG. 16. As a consequence, the thin film electrodes 34 of the first connector 32 are contacted with the thin film electrodes 34 of the second connector 36 to thereby achieve electrical connection therebetween.

Figure 17:
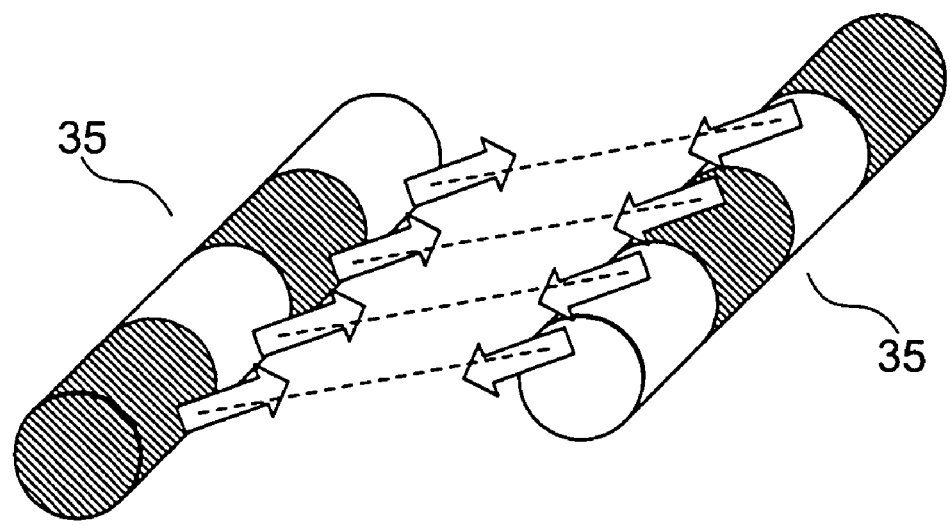

In case where alignment between the N and the S poles of the first connector 32 and the S and the N poles of the second connector 36 is not proper, repulsive force acts between same poles (i.e., those poles having the same polarity) of the magnets 35 of the first and the second connectors 32 and 36 as shown in FIG. 17. Therefore, the first connector 32 is separated from the second connector 36 so that electrical connection therebetween is not obtained. However, if the misalignment is small, the first and the second connectors 32 and 36 are corrected in position and connected to each other.

Figure 18A:
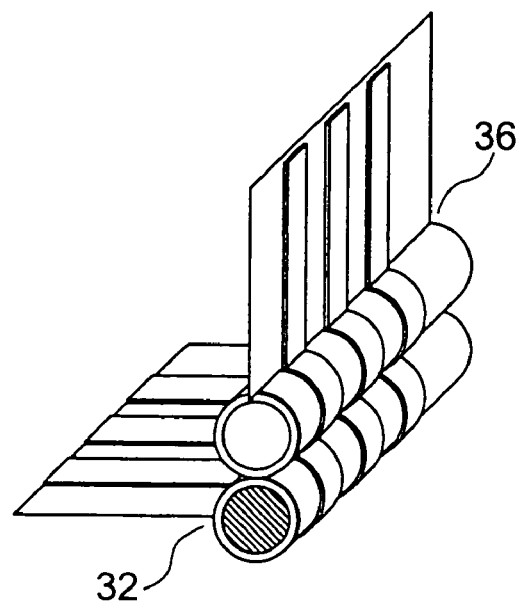
FIGS. 18A to 18C are perspective views for describing an operation of the connector apparatus in FIG. 14.
Figure 18B:
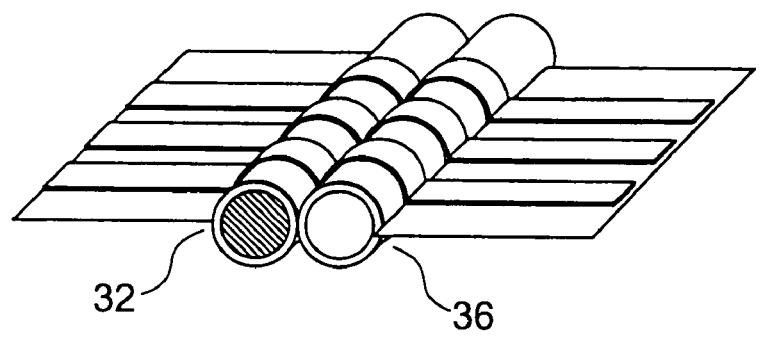
Figure 18C:
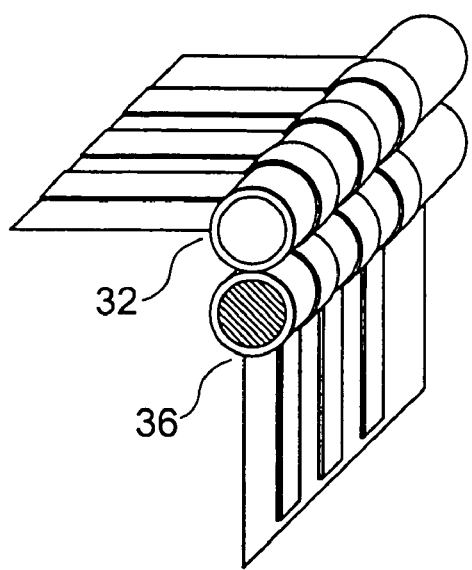

The angle of connection of the FPC connectors can be changed in any desired manner. Referring to FIG. 18A, the first connector 32 is arranged in the horizontal direction while the second connector 36 is arranged in the vertical direction on an up side of the first connector 32. Referring to FIG. 18B, the first and the second connectors 32 and 36 are arranged in the horizontal direction. Referring to FIG. 18C, the first connector 32 is arranged in the horizontal direction while the second connector 36 is arranged in the vertical direction on a down side of the first connector 32.

With the connector apparatus described in conjunction with FIGS. 14 to 18C, the thin film electrodes are stably connected to each other under the load of the magnetic force alone. Thus, no special means is required to connect the FPC connector so that the connector can be reduced in size and occupied space. Further, in case of misalignment between the first and the second connectors, the FPC connector is prevented from being improperly connected.

Referring to FIGS. 19 through 23, description will be made of a connector apparatus according to a seventh embodiment of this invention. For the connector apparatus 41 illustrated in the figures, the magnets as a characteristic part alone will be described.

Figure 19:
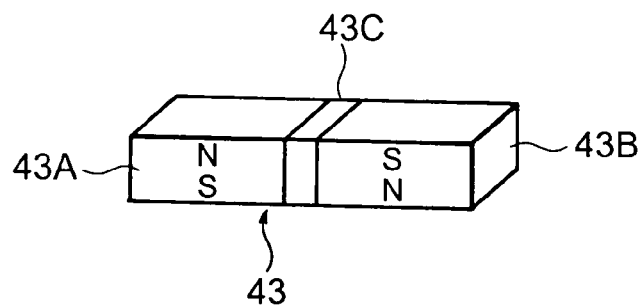
FIGS. 19 to 22 are perspective views for describing a connector apparatus according to a seventh embodiment of this invention.

As illustrated in FIG. 19, a single magnetic plate 43 is perpendicularly magnetized in its thickness direction to form two magnets 43A and 43B at two positions. Between the magnets 43A and 43B, a neutral region 43C is formed. The magnets 43A and 43B are arranged so that N poles and S poles are reversed in the vertical direction.

Figure 20:
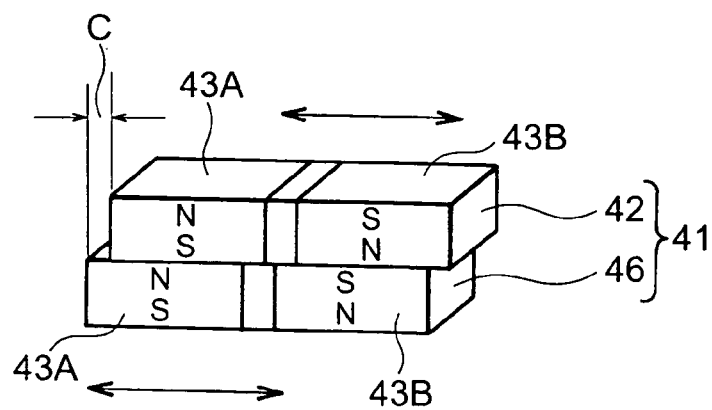

Referring to FIG. 20, when a first connector 42 on an upper side is connected to a second connector 46 on a lower side, a gap C may be left between the N and the S poles of the magnets 43A and 43B of the first connector 42 and the S and the N poles of the magnets 43A and 43B of the second connector 46. As the gap C is greater, the accuracy of connection of the connector apparatus 41 is lowered.

Figure 21:
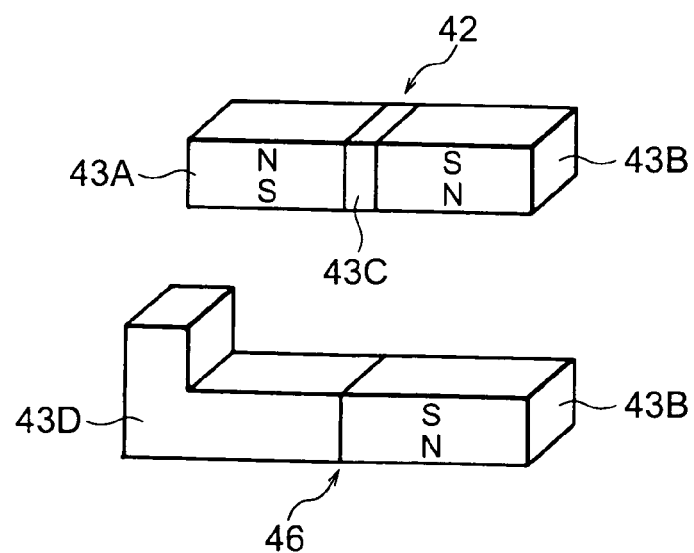

In view of the above, an L-shaped stopper 43D as a neutral region is formed adjacent a left end face of the magnet 43B of the second connector 46 instead of the magnet 43A, as shown in FIG. 21.

Figure 22:
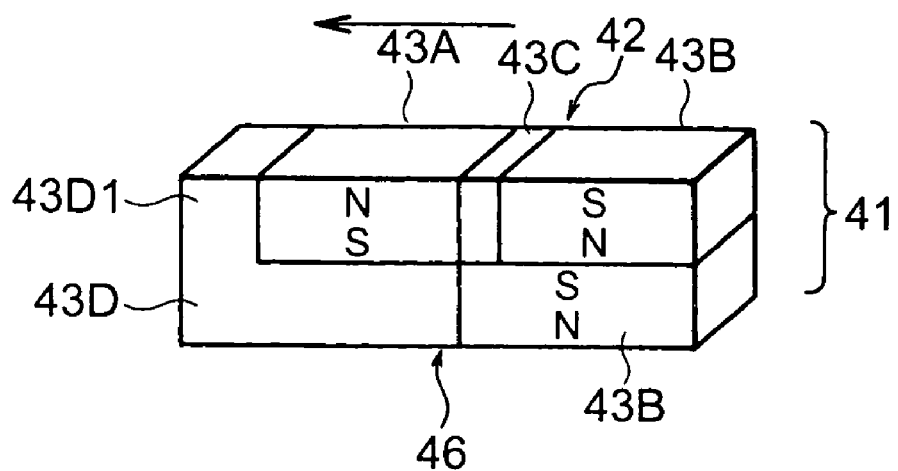
Figure 23:
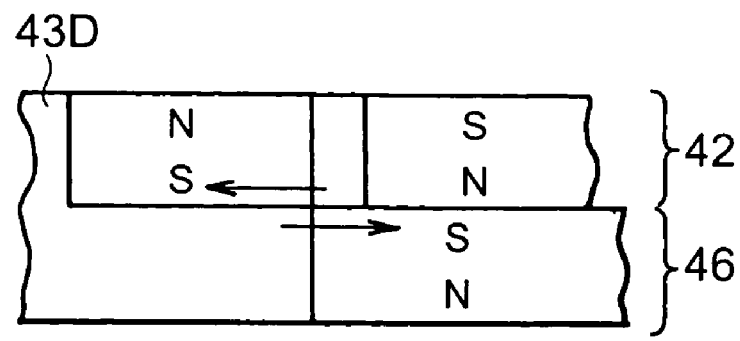
FIG. 23 is an enlarged view of a part of FIG. 22.

Referring to FIG. 22, when the first connector 42 is connected to the second connector 46, a left end face of the magnet 43A of the first connector 42 is butted to a protruding portion 43D1 of the stopper 43D of the second connector 46. Then, as shown in FIG. 23, magnetic force acts as repulsive force in directions depicted by arrows between the N pole of the magnet 43A of the first connector 42 and the N pole of the magnet 43B of the second connector 46. Therefore, the alignment between the first and the second connectors 42 and 46 is kept in a proper condition so that the connector apparatus 41 achieves high-accuracy connection.

Referring to FIGS. 24 through 27, description will be made of a connector apparatus according to an eighth embodiment of this invention.

Figure 24:
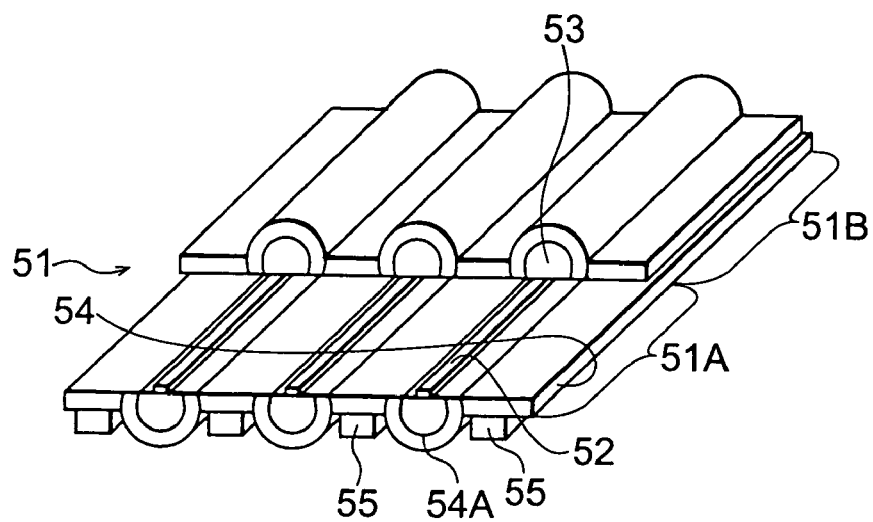
FIG. 24 is a perspective view of a connector according to an eighth embodiment of this invention.

The connector apparatus 51 illustrated in the figures comprises a forward part 51A and a rearward part 51B, as shown in FIG. 24.

The forward part 51A of the connector apparatus 51 comprises three center electrodes 52 formed by metal thin films, three semi-cylindrical cohesive members 53 holding the center electrodes 52, respectively, a peripheral electrode 54 formed by a metal thin film and provided with three semi-cylindrical grooves 54A receiving the cohesive members 53, respectively, and four magnets 55 fixed to opposite sides of the grooves 54A.

The rearward part 51B comprises two rearward components each of which is similar in structure to the forward part 51A except that the magnets 55 are not provided and which are stacked one on another so that the center electrodes 52 are positioned at the center.

Figure 25:
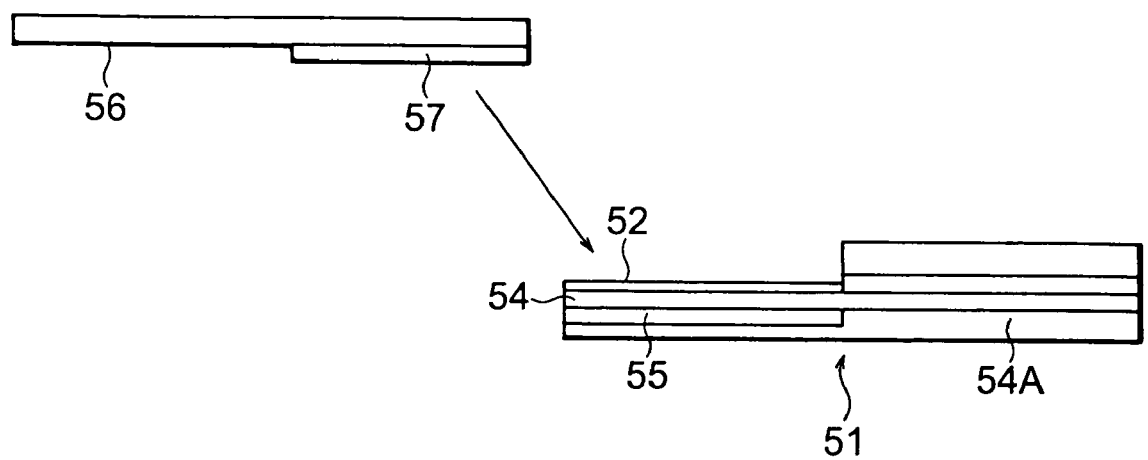
FIG. 25 is a view for describing an operation of connecting a wiring board to the connector in FIG. 24.

When the connector apparatus 51 is connected to a wiring substrate 56, the connector apparatus 51 and the wiring substrate 56 are relatively moved towards each other in a direction depicted by an arrow in FIG. 25 so as to bring the center electrodes 52 of the forward part 51A into contact with electrodes 57 of the wiring substrate 56. At this time, attractive force acts between the magnets 55 of the forward part 51A and magnets (not shown) attached to a lower surface of the wiring substrate 56.

Referring to FIGS. 26A to 26D and 27A to 27C, a production process of the connector apparatus 51 will be described.

The production process comprises a series of steps (1) to (7) carried out in this order.

Figure 26A:
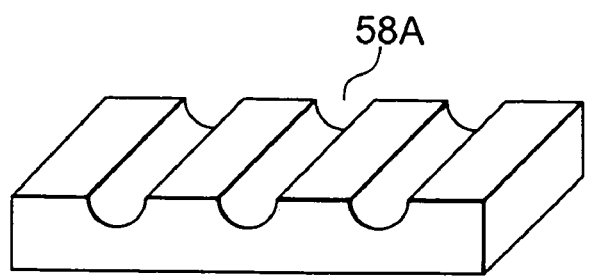
FIGS. 26A to 26D and 27A to 27C show a series of steps of a production process of the connector apparatus in FIG. 24.

(1) Three semi-cylindrical grooves 58A are formed on a jig 58 as shown in FIG. 26A.

Figure 26B:
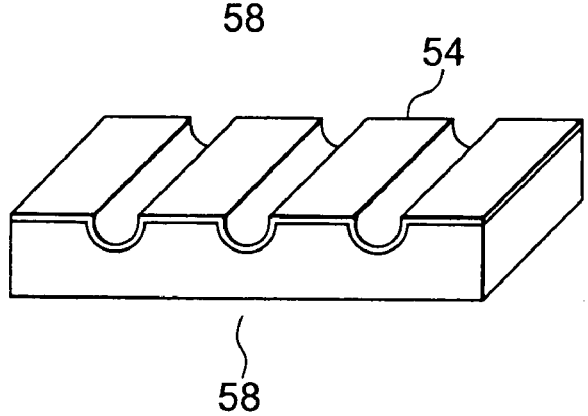

(2) A metal thin film (peripheral electrode 54) is deposited by sputtering or plating on the jig 58 as shown in FIG. 26B.

Figure 26C:
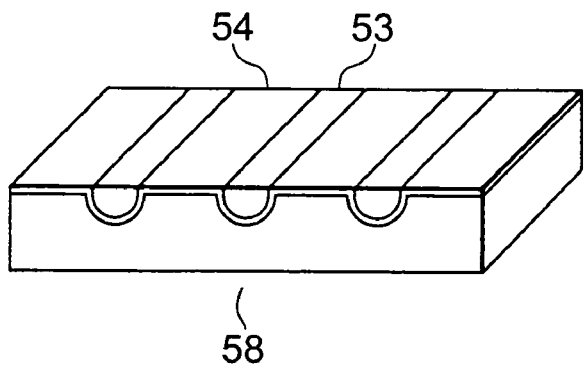

(3) After the metal thin film is formed, the cohesive member 53 is applied in each groove 58A as shown in FIG. 26C.

Figure 26D:
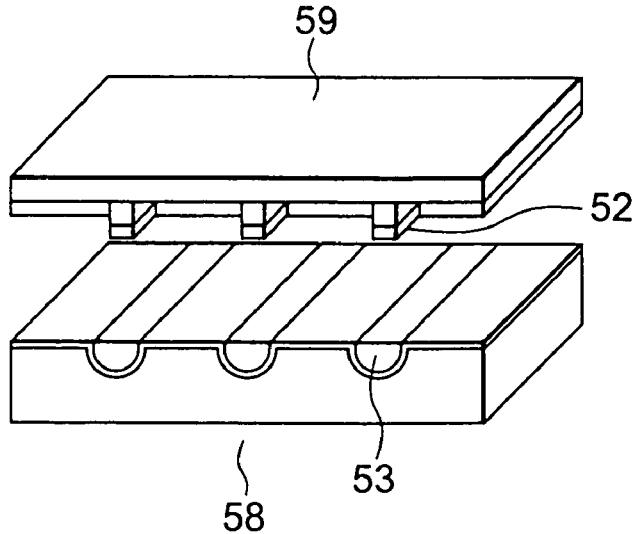

(4) According to the method described in Japanese Patent Application Publication (JP-A) No. 2001-210933, three metal thin films (center electrodes 52) on a die 59 are transferred onto the cohesive members 53 in registry with their centers as shown in FIG. 26D.

Figure 27A:
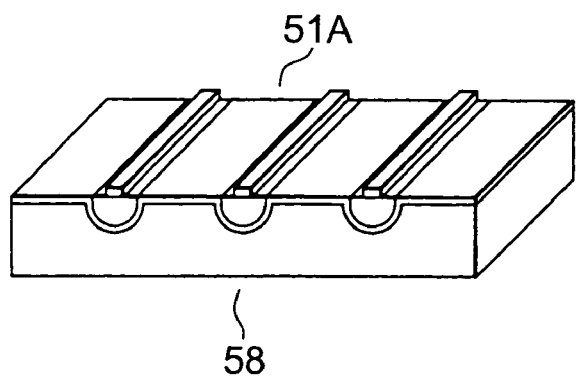

(5) After transfer, a component as the forward part 51A is formed on the jig 58 as shown in FIG. 27A. However, the magnets 55 are not yet attached.

Figure 27B:
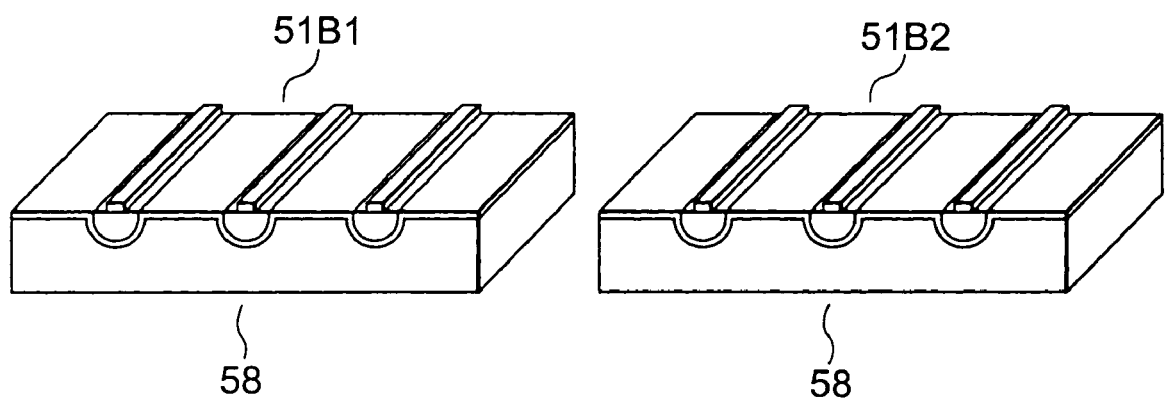

(6) Two more similar components as rearward components 51B1 and 51B2 to be combined into the rearward part 51B are formed as shown in FIG. 27B.

Figure 27C:
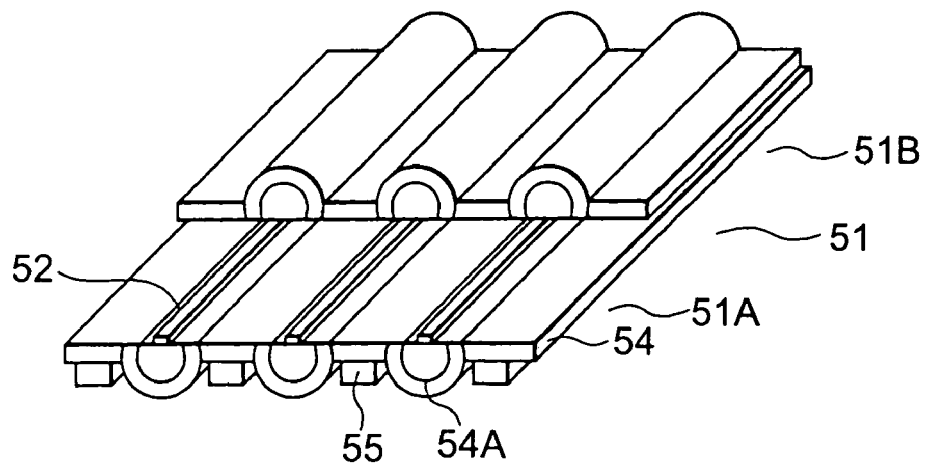

(7) Finally, each of the forward part 51A and the rearward components 51B1 and 51B2 is separated from the jig 58. Then, the magnets 55 are fixed to opposite sides of the grooves 54A of the forward part 51A as shown in FIG. 27C. The rearward components 51B1 and 51B2 are stacked one on another so that the center electrodes 52 are positioned at the center. Thus, the rearward part 51B of a coaxial type is obtained. The forward part 51A and the rearward part 51B are connected to each other to complete the connector apparatus 51.

Figure 28:
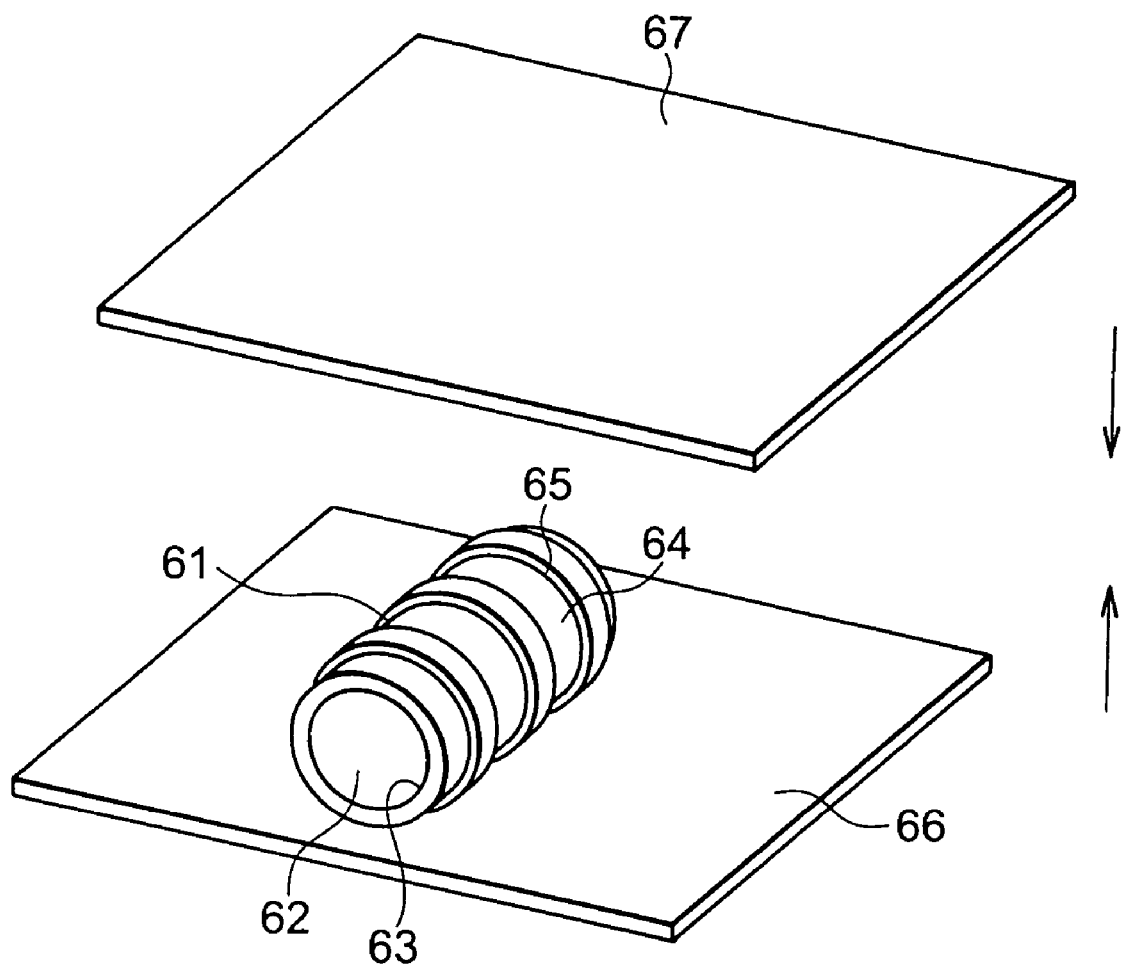
FIG. 28 is a perspective view of a connector apparatus according to a ninth embodiment of this invention.

Referring to FIGS. 28 and 29, description will be made of a connector apparatus according to a ninth embodiment of this invention.

The connector apparatus 61 illustrated in FIG. 28 comprises a cylindrical magnet 62, a base member 63 of a cylindrical shape surrounding the magnet 62, a cohesive member 64 applied on a surface of the base member 63, and three strip-like metal thin films 65 transferred onto the cohesive member 64 around the cohesive member 64.

An operation of connecting two wiring boards 66 and 67 by the connector apparatus 61 is carried out in the following manner. At first, the metal tin films 65 of the connector 61 are contacted with electrodes (not shown) formed on a surface of the wiring substrate 66. Then, electrodes (not shown) formed on a surface of the wiring substrate 67 are contacted with the metal thin films 65 of the connector 61. As a consequence, the connector apparatus 61 is clamped between the wiring substrates 66 and 67. Each of the wiring substrates 66 and 67 is provided with a magnet (not shown) embedded therein. In the clamped state, the metal thin films 65 are forced into the cohesive member 64 so that the metal thin films 65 and the cohesive member 64 are flush or coplanar with each other. The wiring substrates 66 and 67 are kept close to each other by attractive force acting between the magnets of the wiring substrates 66 and 67 and the magnet 62 of the connector 61 and are adhered by the cohesive member 64.

Referring to FIGS. 29A through 29C, description will be made of a production process of the connector apparatus 61.

As shown in FIG. 29A, the cohesive agent 64 is applied onto the surface of the base member 63 of a rectangular shape. The three metal thin films 65 as electrode patterns are transferred onto the surface of the cohesive member 64. Transfer is carried out by means of the technique described in Japanese Patent Application Publication (JP-A) No. 2001-210933 mentioned above.

The base member 63, the cohesive member 64, and the metal thin films 65 are rolled utilizing their flexibility to form the connector 61 of a circular cylindrical shape shown in FIG. 29B or a rectangular cylindrical shape shown in FIG. 29C.

The connector apparatus 61 can be as small as about 0.9 mm in diameter. Therefore, in case where the wiring substrates are electrically and mechanically connected, reduction in pitch, size, and profile of the connector can be promoted.

While this invention has thus far been described in conjunction with the preferred embodiment thereof, it will be readily possible for those skilled in the art to put this invention into practice in various other manners without departing from the scope set forth in the appended claims.

What is claimed is:

1. A magnetic connector acquiring connection with a mating connector by utilizing magnetic force, the connector comprising:

a base member having a particular surface to be faced to the mating connector upon connection, the particular surface being cohesive; and an electrode terminal fixed to the particular surface of the base member so as to expose the particular surface partially, and the electrode terminal being adapted to be electrically connected to the mating connector, the base member having a magnetic force generating portion having a plurality of magnetic poles for producing the magnetic force, N and the S poles of the magnetic poles being alternately arranged along the particular surface in a predetermined direction, the connector being properly positioned relative to the mating connector by the magnetic force, and the base member having an elastic insulating layer coupled to the magnetic force generating portion and defining the particular surface, the electrode terminal being fixed to the insulating layer.

2. The magnetic connector according to claim 1, wherein the magnetic force generating portion has a plurality of permanent magnets arranged adjacent to each other in the predetermined direction.

3. The magnetic connector according to claim 2, wherein the magnetic force generating portion has a magnetically neutral member interposed between adjacent ones of the permanent magnets.

4. The magnetic connector according to claim 1, wherein the magnetic force generating portion has a magnetic material of a plate-like shape, the magnetic poles being formed by perpendicular magnetization of the magnetic material in its thickness direction and arranged adjacent to each other in the predetermined direction.

5. The magnetic connector according to claim 4, wherein the magnetic material has an unmagnetized portion interposed between adjacent ones of the magnetic poles.

6. The magnetic connector according to claim 1, wherein the electrode terminal comprises a metal thin film extending along the particular surface.

7. The magnetic connector according to claim 6, wherein the insulating layer has a cohesive layer interposed between the magnetic force generating portion and the metal thin film, the cohesive layer defining the particular surface that is cohesive.

8. The magnetic connector according to claim 7, wherein the insulating layer has a resin layer interposed between the magnetic force generating portion and the cohesive layer.

9. The magnetic connector according to claim 8, wherein the insulating layer has a cohesive layer interposed between the magnetic force generating portion and the resin layer.

10. The magnetic connector according to claim 1, wherein the particular surface is formed as a flat surface.

11. The magnetic connector according to claim 1, wherein the particular surface is formed as a cylindrical surface around an axis extending in the predetermined direction.

12. The magnetic connector according to claim 1, wherein the base member has a stopper formed at one end in the predetermined direction to engage the mating connector.

13. The magnetic connector according to claim 1, wherein the magnetic poles comprise a first one and a second one which are different from each other in size in the predetermined direction.

* * * * *